US010310339B2

(12) United States Patent
Itou et al.

(10) Patent No.: US 10,310,339 B2
(45) Date of Patent: *Jun. 4, 2019

(54) LIQUID CRYSTAL DISPLAY DEVICE AND METHOD FOR MANUFACTURING THE SAME

(71) Applicant: Japan Display Inc., Tokyo (JP)

(72) Inventors: Osamu Itou, Hitachi (JP); Takato Hiratsuka, Chiba (JP); Masanao Yamamoto, Mobara (JP); Toshimasa Ishigaki, Chiba (JP); Daisuke Sonoda, Chiba (JP)

(73) Assignee: Japan Display Inc., Tokyo (JP)

( * ) Notice: Subject to any disclaimer, the term of this patent is extended or adjusted under 35 U.S.C. 154(b) by 521 days.

This patent is subject to a terminal disclaimer.

(21) Appl. No.: 15/157,606

(22) Filed: May 18, 2016

(65) Prior Publication Data

US 2016/0291428 A1    Oct. 6, 2016

Related U.S. Application Data

(63) Continuation of application No. 13/739,477, filed on Jan. 11, 2013, now Pat. No. 9,366,919.

(30) Foreign Application Priority Data

Jan. 19, 2012 (JP) .................... 2012-008974

(51) Int. Cl.
G02F 1/1333 (2006.01)
G02F 1/1337 (2006.01)
(Continued)

(52) U.S. Cl.
CPC ...... G02F 1/134363 (2013.01); G02F 1/1337 (2013.01); G02F 1/13394 (2013.01);
(Continued)

(58) Field of Classification Search
None
See application file for complete search history.

(56) References Cited

U.S. PATENT DOCUMENTS 7,548,295 B2   6/2009   Kawasaki et al.
7,688,413 B2   3/2010   Ito
(Continued)

FOREIGN PATENT DOCUMENTS

JP   6-214244   8/1994
JP   9-211477   8/1997
(Continued)

OTHER PUBLICATIONS

Japanese Office Action issued in Japanese Patent Application No. 2012-008974, dated Dec. 10, 2013; 4 pages, including English translation.

*Primary Examiner* — Jessica M Merlin
*Assistant Examiner* — Mark D Teets
(74) *Attorney, Agent, or Firm* — Ulmer & Berne LLP

(57) ABSTRACT

In a wall electrode liquid crystal display device, planar distribution of the wall structure and the electrode is optimized to improve a yield. A liquid crystal display device includes a plurality of pixels arranged in a matrix, each of the pixels having an insulator wall structure formed at a border of pixels, a wall electrode formed at a side surface of the wall structure of the border of the pixels, a source electrode which is continuous with the wall electrode and formed of a planar electrode extending in a planar direction, a first common electrode provided between source electrodes at both sides of the pixel to form a retentive capacitance, and a second common electrode provided between wall electrodes on both sides of the pixel. A slit which becomes a border of the wall electrodes of two adjacent pixels is disposed only on a top of the wall structure.

7 Claims, 19 Drawing Sheets

(51) Int. Cl.
*G02F 1/1339* (2006.01)
*G02F 1/1343* (2006.01)
*H01L 33/00* (2010.01)

(52) U.S. Cl.
CPC .. *G02F 1/133345* (2013.01); *G02F 1/133377* (2013.01); *H01L 33/0041* (2013.01); *G02F 1/133707* (2013.01); *G02F 2001/134318* (2013.01); *G02F 2001/134381* (2013.01)

(56) References Cited

U.S. PATENT DOCUMENTS

| | | |
|---|---|---|
| 7,728,942 B2 | 6/2010 | Hirakata et al. |
| 9,366,919 B2 * | 6/2016 | Itou .................. G02F 1/133377 |
| 2005/0146658 A1 | 7/2005 | Kim et al. |
| 2006/0055861 A1 | 3/2006 | Hirota |
| 2012/0257156 A1 | 10/2012 | Hiratsuka et al. |
| 2013/0016314 A1 | 1/2013 | Itou et al. |
| 2013/0033653 A1 | 2/2013 | Hiratsuka et al. |
| 2013/0148048 A1 | 6/2013 | Hiratsuka et al. |
| 2013/0182211 A1 | 7/2013 | Hiratsuka et al. |

FOREIGN PATENT DOCUMENTS

| | | |
|---|---|---|
| JP | 2004-302448 A | 10/2004 |
| JP | 2004-341465 A | 12/2004 |
| JP | 2004-361977 A | 12/2004 |
| JP | 2011-8239 A | 1/2011 |

* cited by examiner

LIQUID CRYSTAL DISPLAY DEVICE AND METHOD FOR MANUFACTURING THE SAME

CROSS-REFERENCE TO RELATED APPLICATIONS

The present application is a continuation of U.S. patent application Ser. No. 13/739,477 filed on Jan. 11, 2013, which claims priority of Japanese Patent Application JP2012-008974 filed on Jan. 19, 2012. The entire disclosures of each of these applications are hereby incorporated herein by reference.

BACKGROUND OF THE INVENTION

1. Field of the Invention

The present invention relates to a wall electrode type liquid crystal display device, and particularly, to a liquid crystal display device that optimizes a planar distribution of a wall structure and an electrode.

2. Description of the Related Art

The liquid crystal display device has characteristics such as high display quality, thin and lightweight, and low power consumption, and thus is widely used from a small portable terminal to a large screen television.

However, in the liquid crystal display device, a main problem is a viewing angle characteristic. Therefore, in order to achieve a wide viewing angle, an IPS (In-Plane Switching) liquid crystal display device is suggested. In the IPS mode, in a liquid crystal layer which is homogeneously aligned, an intensity of a backlight is controlled by applying an electric field which is parallel to a substrate to rotate a liquid crystal director in a plane of the liquid crystal layer, thereby displaying an image.

Japanese Patent Application Laid-Open Publication No. Hei6(1994)-214244 discloses a liquid crystal display device that includes pixels formed in m×n matrix, active elements in the pixels, a driving unit that applies a predetermined voltage waveform, and a pair of electrodes that constantly maintains an interval between upper and lower electrodes in the pixel and has a predetermined structure in which an electric field which is parallel to a substrate plane is applied between the pair of electrodes to control the alignment state of the liquid crystal molecules and modulate the light (see Abstract).

Japanese Patent Application Laid-Open Publication No. Hei9(1997)-211477 discloses a traverse electric field driving liquid crystal electro-optical device that has a pair of substrates at least one of which is transparent and a liquid crystal layer disposed between the pair of substrates, wherein a pixel electrode that may form an electric field having a main component in a direction parallel to the substrate plane and a common electrode are provided on any one of the pair of substrates, the pixel electrode and the common electrode are provided on a wall having a predetermined height, and the wall is formed of an auxiliary capacitive electrode and an insulator that covers the auxiliary capacitive electrode (see Abstract).

SUMMARY OF THE INVENTION

A wall electrode mode IPS that applies an ideal traverse electric field in a liquid crystal layer to achieve a transmittance which exceeds that of a current IPS mode has been reviewed. A height of the wall structure of the wall electrode IPS is equal to a thickness of the liquid crystal layer, for example, approximately 4 μm. During the manufacturing process thereof, a photo process of a transparent electrode (ITO electrode) becomes an issue. If slits which become a border of two transparent electrodes are distributed on both a top of the wall structure and a flat portion, when collectively processing the slits, a thickness of the resist or a focusing method of a stepper is varied on the top of the wall structure and the flat portion. Therefore, the top of the wall structure may be overetched and the flat portion may be underetched. To counter this, for example, it is considered that a width of the slit on a mask becomes smaller than a completion size on the top of the wall structure but larger than that on the flat portion. However, if the slit climbs over the wall structure, it is an object how to determine a width of the slit near a climb-over portion. In contrast, even though a mask is perfectly drawn to and near the climb-over portion, if the wall structure and the electrode are aligned, the effect may not be obtained. Therefore, the wall electrode mode IPS has an object to optimize the planar distribution of the wall structure and the electrode.

Japanese Patent Application Laid-Open Publication No. Hei6(1994)-214244 and Japanese Patent Application Laid-Open Publication No. Hei9(1997)-211477 disclose a liquid crystal display device having an electrode which is independently controlled on both wall surfaces of the wall structure, but do not mention the optimization of the planar distribution of the wall structure and the electrode.

An object of the present invention is to optimize the planar distribution of the wall structure and the electrode in the wall electrode mode IPS and improve a yield.

In order to address the above-mentioned problem, for example, configurations described in the appended claims are adopted.

An example of the liquid crystal display device according to the present invention includes a plurality of pixels arranged in a matrix, each of the pixels having an insulator wall structure formed at a border of pixels, a wall electrode formed on a side of the wall structure at the border of the pixels, a source electrode which is continuous with the wall electrode and formed of a planar electrode extending in a planar direction from a position where the wall electrode is in contact with a substrate, a first common electrode provided between the source electrodes at both sides of the pixel and partially superimposed with the planar electrode with an insulating layer interposed therebetween to form a retentive capacitance, and a second common electrode provided between wall electrodes on both sides of the pixel. A slit which becomes a border of the wall electrodes of two adjacent pixels is selectively disposed on a top of the wall structure.

In an example of a method of manufacturing a liquid crystal display device according to the present invention, the liquid crystal display device includes a plurality of pixels arranged in a matrix, each of the pixels having an insulator wall structure formed at a border of pixels, a wall electrode formed from a side to the top surface of the wall structure at the border of the pixels, a source electrode which is continuous with the wall electrode and formed of a planar electrode extending in a planar direction from a position where the wall electrode is in contact with a substrate, a first common electrode which is provided between the source electrodes at both sides of the pixel and is partially superimposed with the planar electrode with an insulating layer interposed therebetween to form a retentive capacitance, and a second common electrode provided between wall electrodes on both sides of the pixel. The method includes a step of forming a transparent electrode on the entire surface on a substrate at a TFT side on the wall structure; a step of applying a resist on the transparent electrode; a step of exposing the resist to expose the transparent electrode on the wall structure using such a mask that disposes a slit which becomes a border of the wall electrodes of two adjacent pixels on the top of the wall structure; and a step of removing the exposed transparent electrode on the wall structure to form a wall electrode in which the slit which becomes a border of the wall electrodes of two adjacent pixels is disposed on the top of the wall structure.

In another example of a method of manufacturing a liquid crystal display device according to the present invention, the liquid crystal display device includes a plurality of pixels arranged in a matrix, each of the pixels having an insulator wall structure formed at a border of pixels, a wall electrode formed on a side of the wall structure at the border of the pixels, a source electrode which is continuous with the wall electrode and formed of a planar electrode extending in a planar direction from a position where the wall electrode is in contact with a substrate, a first common electrode which is provided between the source electrodes at both sides of the pixel and is partially superimposed with the planar electrode with an insulating layer interposed therebetween to form a retentive capacitance, and a second common electrode provided between wall electrodes on both sides of the pixel. The method includes a step of forming a transparent electrode on the entire surface on a substrate at a TFT side on the wall structure; a step of applying a resist on the transparent electrode; a step of ashing the resist to expose the transparent electrode on the wall structure; and a step of removing the exposed transparent electrode on the wall structure to form a wall electrode on the sides of the wall structure.

According to the aspects of the present invention, a height of a portion where a slit which becomes a border of transparent electrodes of two adjacent pixels is present is constantly maintained. Therefore, the processing condition is uniquely determined and a yield of the wall electrode mode IPS is improved. Further, it is possible to stably provide a wall electrode mode IPS having a transmittance which exceeds that of the current IPS mode.

DETAILED DESCRIPTION OF THE INVENTION

Figure 1:
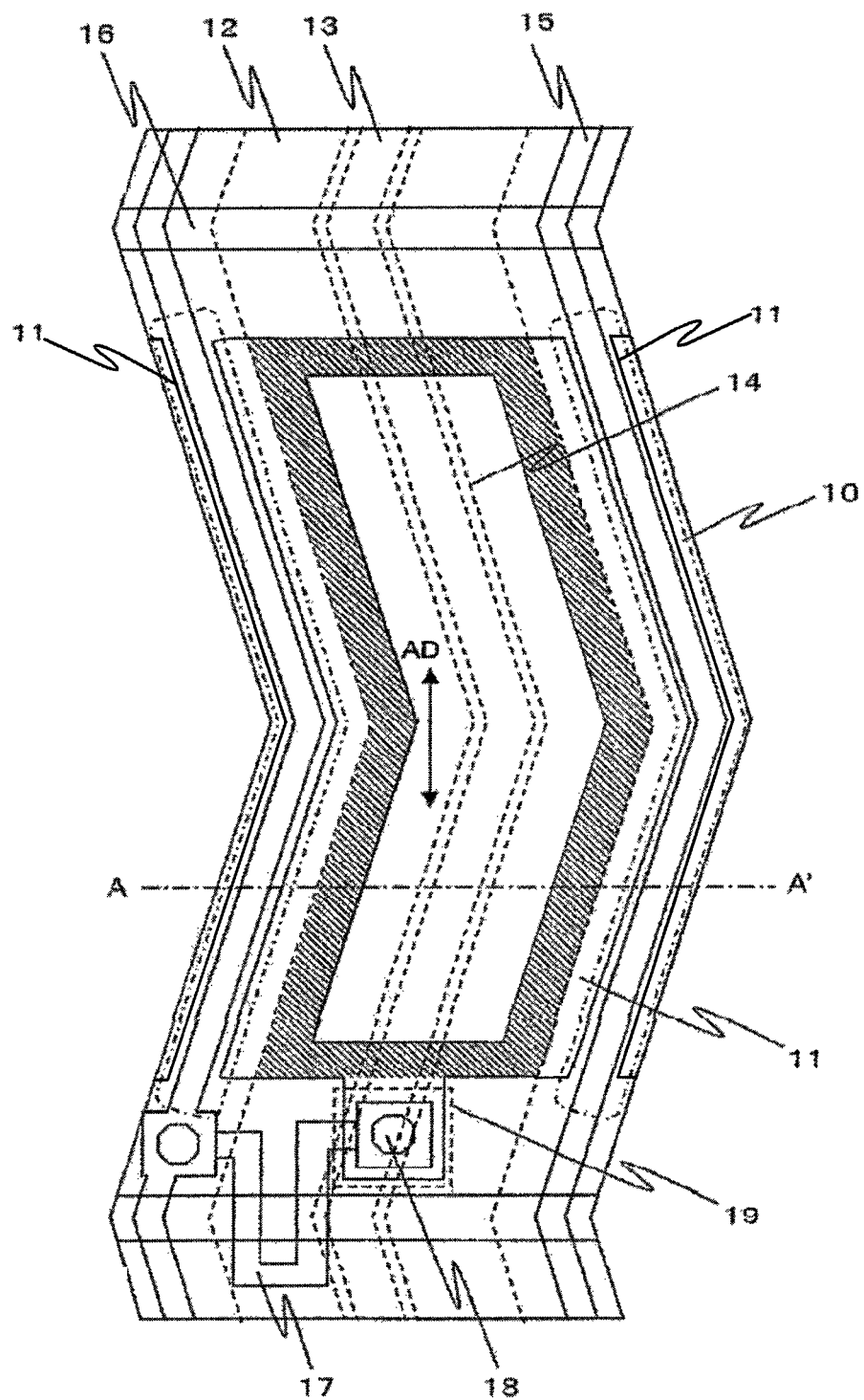
FIG. 1 is a view illustrating a planar structure of a pixel of a liquid crystal display device according to a first embodiment of the present invention.

Hereinafter, embodiments of the present invention will be described with reference to the drawings. In the entire drawings that illustrate the embodiments, components that have the same functions are denoted by the same reference numerals and the repetitive description thereof will be omitted.

First Embodiment

Figure 14:
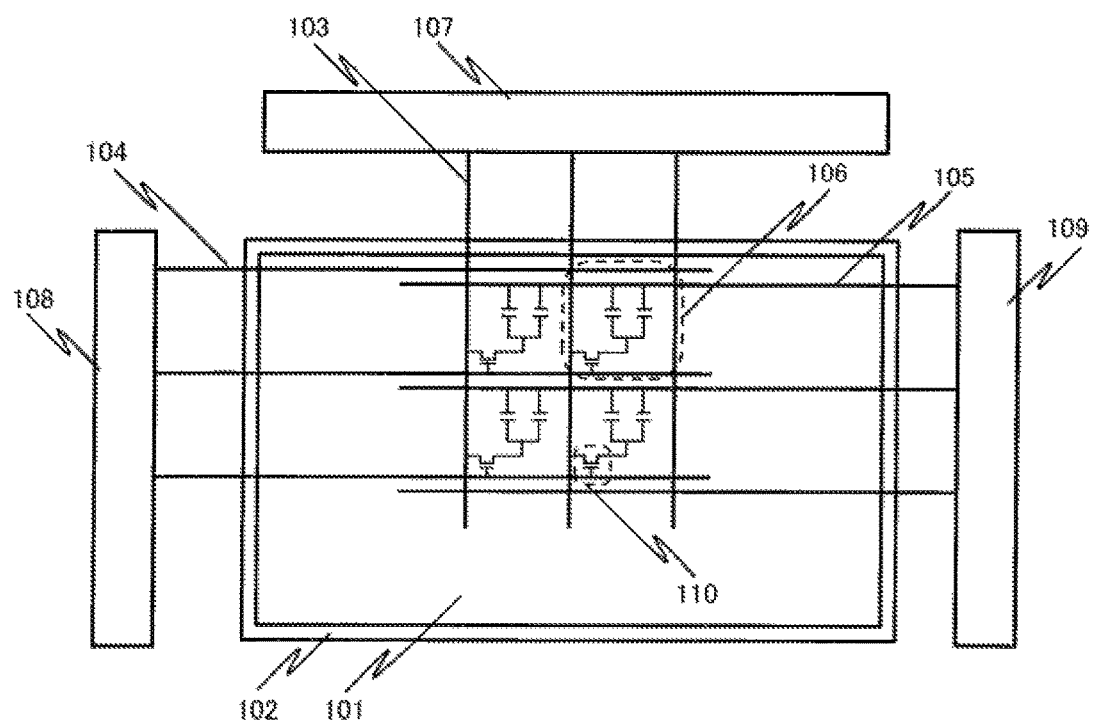
FIG. 14 is a view illustrating an example of an equivalent circuit of a liquid crystal display device to which the present invention is applied.

First, in FIG. 14, an example of an equivalent circuit of a liquid crystal display device to which the present invention is applied is illustrated. On a substrate 102, scanning lines 104 and signal lines 103 are arranged in a matrix and pixels 106 are connected to intersections of the scanning lines 104 and the signal lines 103 through TFT (thin film transistor) elements 110. A scanning driving circuit 108 and a signal driving circuit 107 are connected to the scanning lines 104 and the signal lines 103, respectively to apply a voltage to the scanning lines 104 and the signal lines 103. On the substrate 102, common lines 105 are disposed so as to be parallel to the signal lines 103. A common voltage is applied from a common voltage generating circuit 109 to all pixels. A liquid crystal composition is encapsulated between the substrate 102 and a substrate 101 so as to entirely configure the liquid crystal display device.

Figure 2:
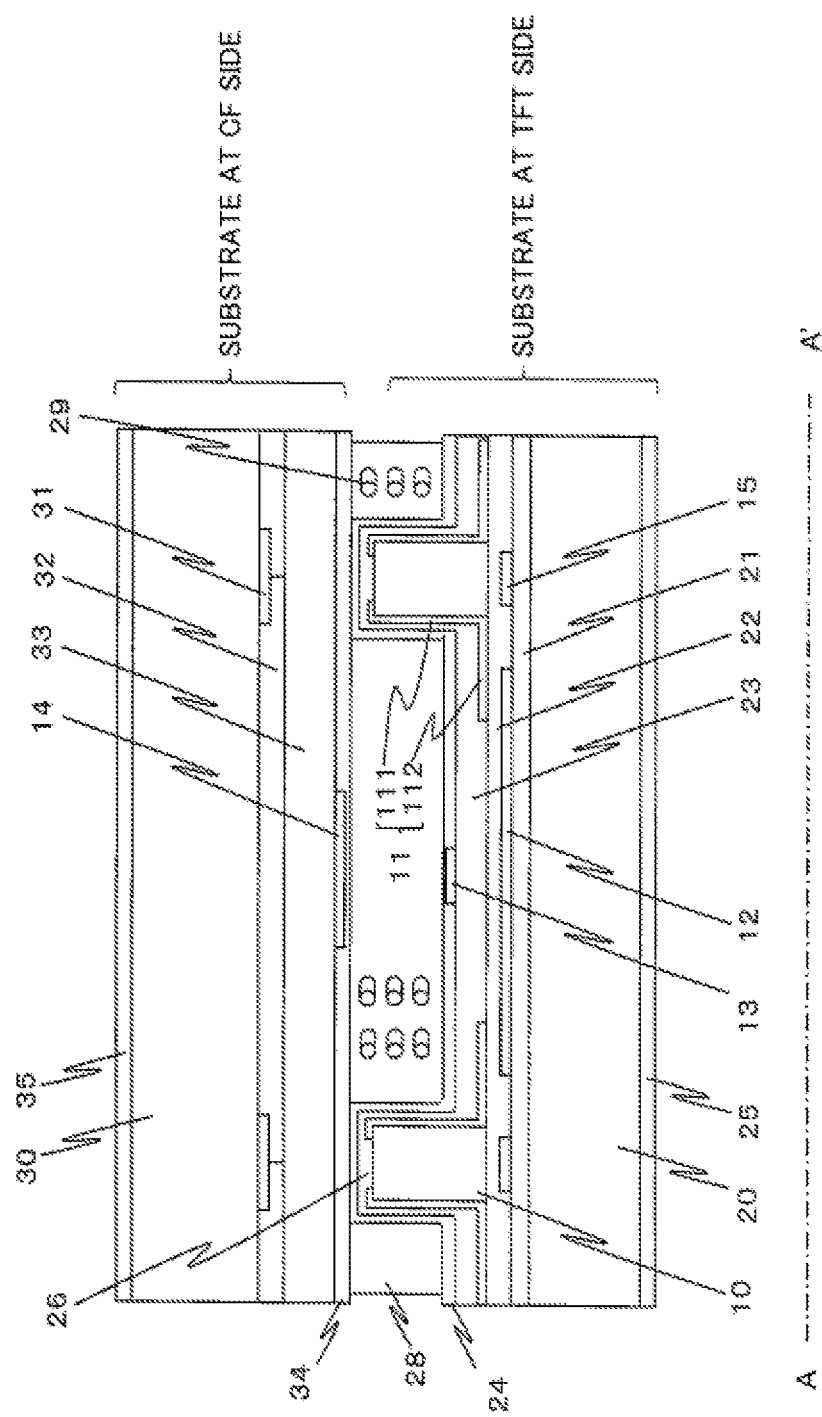
FIG. 2 is a view illustrating a sectional structure of a pixel of the liquid crystal display device according to the first embodiment of the present invention.

FIG. 1 illustrates a planar structure of one pixel according to a first embodiment of the present invention and FIG. 2 illustrates a sectional structure of one pixel. In FIG. 1, an entire one pixel and a part of an adjacent pixel are included. Further, FIG. 2 illustrates a sectional structure taken along line A-A' of FIG. 1.

In FIG. 2, on a first substrate 20, a signal wiring line 15 and a first common electrode 12 are disposed with a first insulating layer 21 interposed therebetween and a second insulating layer 22 is formed thereon. An insulator wall structure 10 is provided at a border of both sides of a pixel. The wall structure, for example, is formed on an organic film. In the wall structure 10 disposed at both sides of the pixel, a wall electrode 111 is formed at a side of the wall structure and a flat electrode 112 is formed which is continuous with the wall electrode and extends in a planar direction from the position where the wall electrode is in contact with the substrate. In the embodiment, the wall electrode 111 and the flat electrode 112 form one source electrode 11. The first common electrode 12 and the flat electrode 112 of the source electrode 11 are partially superimposed with a second insulating layer 22 interposed therebetween and the superimposed portion forms a retentive capacitance. A third insulating layer 23 is formed above the source electrode 11 and a second common electrode 13 is disposed between the wall electrodes 111 of both the source electrodes 11 provided in the wall structure 10 above the third insulating layer 23. A first alignment film 24 is formed so as to cover the second common electrode 13 and the wall structure 10. Further, a first polarizer 25 is formed at an opposite side of the first substrate 20. Accordingly, a substrate at a TFT side is formed.

Further, on a second substrate 30, a black matrix (BM) 31, a color filter (CF) 32, and a protective film (OC: over coat) 33 are formed. On the protective film 33, a third common electrode 14 is disposed between both the source electrodes 11 provided in the wall structure and a second alignment film 34 is formed to configure a substrate at a CF side.

In addition, the substrate at a TFT side and the substrate at a CF side are bonded together and a liquid crystal layer 28 including liquid crystal molecules 29 is encapsulated between the two substrates. A second polarizer 35 is formed at an opposite side of the second substrate 30.

In FIG. 1, the wall structure 10 is disposed at both sides of the pixel in a longitudinal direction as illustrated by one-dot chain line. A signal wiring line 15 is disposed along the wall structure 10 and a gate wiring line 16 is disposed so as to intersect the signal wiring line 15. The source electrodes 11 are disposed on side surfaces of the wall structure 10 and the first common electrode 12, the second common electrode 13, and the third common electrode 14 are disposed between both the source electrodes. The superimposed portion of the first common electrode 12 and the source electrode 11 are represented with hatched lines. The superimposed portion of the first common electrode 12 and the source electrode 11 serves as a retentive capacitance. A polysilicon layer 17 is disposed on the gate wiring line 16 to configure a TFT. Reference numeral 19 denotes a first contact hole and reference numeral 18 denotes a second contact hole.

In the embodiment, as illustrated in FIG. 2, the wall structure 10 is distributed below the BM 31 that forms a border of the pixels and has the source electrodes 11 formed on both wall surfaces of wall structure 10. The source electrodes 11 on both wall surfaces are separated by a slit 26 on the top of the wall structure and belong to different pixels, respectively. As illustrated in FIG. 1, the wall structure 10 is superimposed with the slit that separates the source electrodes 11 and distributed longer than the slit. As a result, the slit is disposed only on the top of the wall structure.

Figure 3:
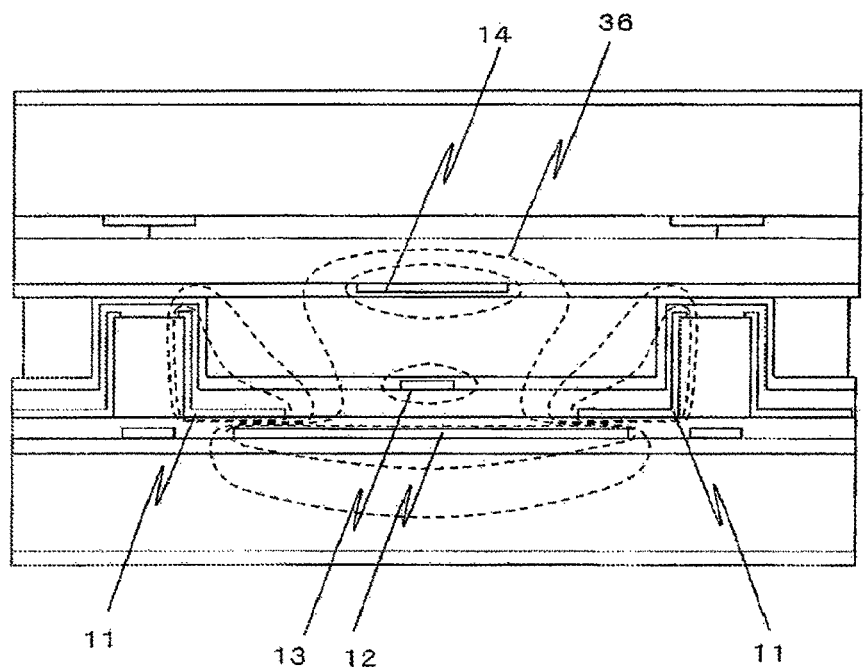
FIG. 3 is a view illustrating an equipotential surface formed between a common electrode and a source electrode according to the first embodiment of the present invention.

FIG. 3 is a schematic view illustrating an equipotential surface 36 formed between the common electrode and the source electrode in FIG. 2 with a broken line. The third common electrode 14 and the second common electrode 13 are disposed so as to face the upper and lower substrates at the center of the pixel and the first common electrode 12 is disposed therebelow. As illustrated by a broken line in FIG. 3, a part of the equipotential surface 36 is formed so as to enclose the third common electrode 14 and the second common electrode 13 so that the third common electrode 14 and the second common electrode 13 show the same property as that of the wall electrode. The source electrode 11 is disposed on the top of the wall structure on both sides of the pixel and a pair of common electrodes 13 and 14 are disposed at the center of the pixel so that an effective distance between the wall electrodes is half of the width of the pixel. For example, even when the width of the pixel is 30 μm, it is possible to be driven at the voltage which is equal to a voltage in the IPS-Pro mode of the related art.

A planar shape of the pixel is open V-shaped as illustrated in FIG. 1 and the wall structure 10 is formed so as to be inclined to the left side on a upper half of the pixel and inclined to the right side on a lower half of the pixel. A liquid crystal alignment direction AD is a vertical direction. When a voltage is applied, a liquid crystal director rotates in a clockwise direction on the upper half of the pixel and rotates in a counterclockwise direction on the lower half of the pixel. Further, in any of the upper half and the lower half of the pixel, an angle formed by the extending direction of the wall structure 10 and the liquid crystal alignment direction AD is 5 degrees. In a multi-domain structure in which two parts having different liquid crystal alignments are formed in one pixel, coloring viewing angle dependencies of individual domains are offset so that non-coloring viewing angle property may be obtained. A wall surface of the wall structure 10 has an inclined angle of 85 degrees. Therefore, in order to perform an alignment processing on the wall surface having a steep inclined angle, an optical alignment method is desirable. Here, the liquid crystal director refers to an average alignment direction of the liquid crystal molecules in a minute region in the liquid crystal layer.

Further, as illustrated in FIG. 1, the wall structure 10 has a planar distribution fragmented at an edge of the pixel. For example, if the liquid crystal layer is formed by a vacuum encapsulating method, the liquid crystal mainly flows along the wall structure 10. The liquid crystal may move to a neighboring wall structure in a fragmented portion of the wall structure so that it is easy to form the liquid crystal layer by the vacuum encapsulating method.

Figure 4A:
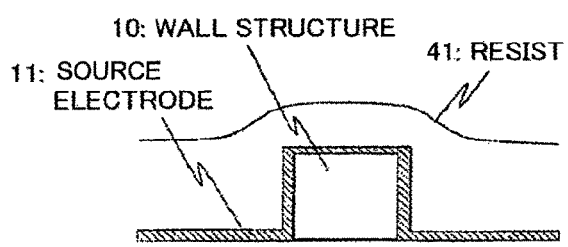
FIG. 4A is a view illustrating a method of patterning a source electrode on a top of a wall structure.

FIG. 4A is a cross-sectional view of a state when a resist 41 is applied when the source electrode 11 is patterned on the top of the wall structure 10. The resist 41 is thinner than the top of the wall structure and thicker than the flat portion. The distribution of the thickness of the resist is caused when the resist flows from the top of the wall structure between the inter-wall structures after applying the resist on the wall structure having a height which is equal to or larger than the thickness of the liquid crystal layer. The resist may be easily formed by spin coat or printing so that the resist generally has the flowability.

The source electrode 11 has a border other than the slit 26. However, the electrodes of the adjacent pixels are not adjacent to each other at the border other than the slit so that an accuracy of a photo process is not strictly required. Since a fatal failure such as a short circuit from an adjacent electrode is caused in the slit, the processing of the slit is specifically important in the photo process of the source electrode. In the embodiment, the distribution of the slit is limited on the top of the wall structure. Therefore, if the processing condition of the slit is optimized in accordance with the thin resist, the slit may be processed with a high yield. Further, the distribution of the slit in the thickness direction is also limited on the top of the wall structure. Therefore, even when a stepper having a small focal depth is used, if the top of the wall structure is focused, the slit may be processed with a high yield.

Second Embodiment

Figure 5:
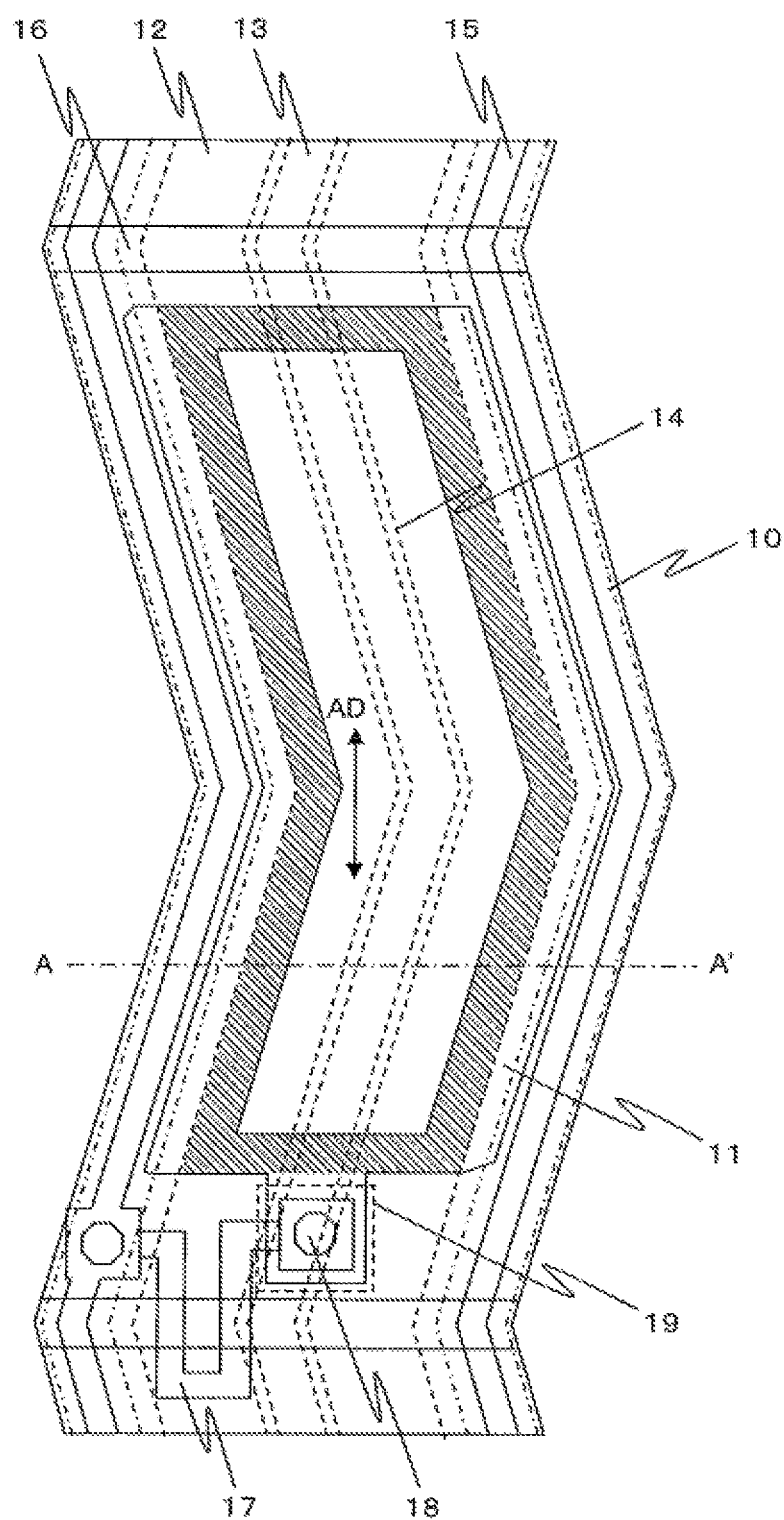
FIG. 5 is a view illustrating a planar structure of a pixel of a liquid crystal display device according to a second embodiment of the present invention.

A planar structure of one pixel according to a second embodiment of the present invention is illustrated in FIG. 5. In the first embodiment, as illustrated in FIG. 1, the wall structure 10 is fragmented at the edge of the pixel. In contrast, in the embodiment, the wall structure 10 is continuous at the edge of the pixel as illustrated in FIG. 5. Therefore, the wall structure 10 which is distributed in one pixel is longer than that in the first embodiment. By doing this, the source electrode 11 may be also formed to be longer along a longitudinal direction of the pixel. If a transparent part in the pixel is increased to increase an aperture ratio, it is possible to obtain a higher transmittance.

In the embodiment, since the wall structure is continuous at the edge of the pixel, even though the source electrode is formed to be longer in the longitudinal direction of the pixel, the slit is distributed only on the top of the wall structure. Therefore, the slit may be processed with a high yield similarly to the first embodiment.

Third Embodiment

Figure 6:
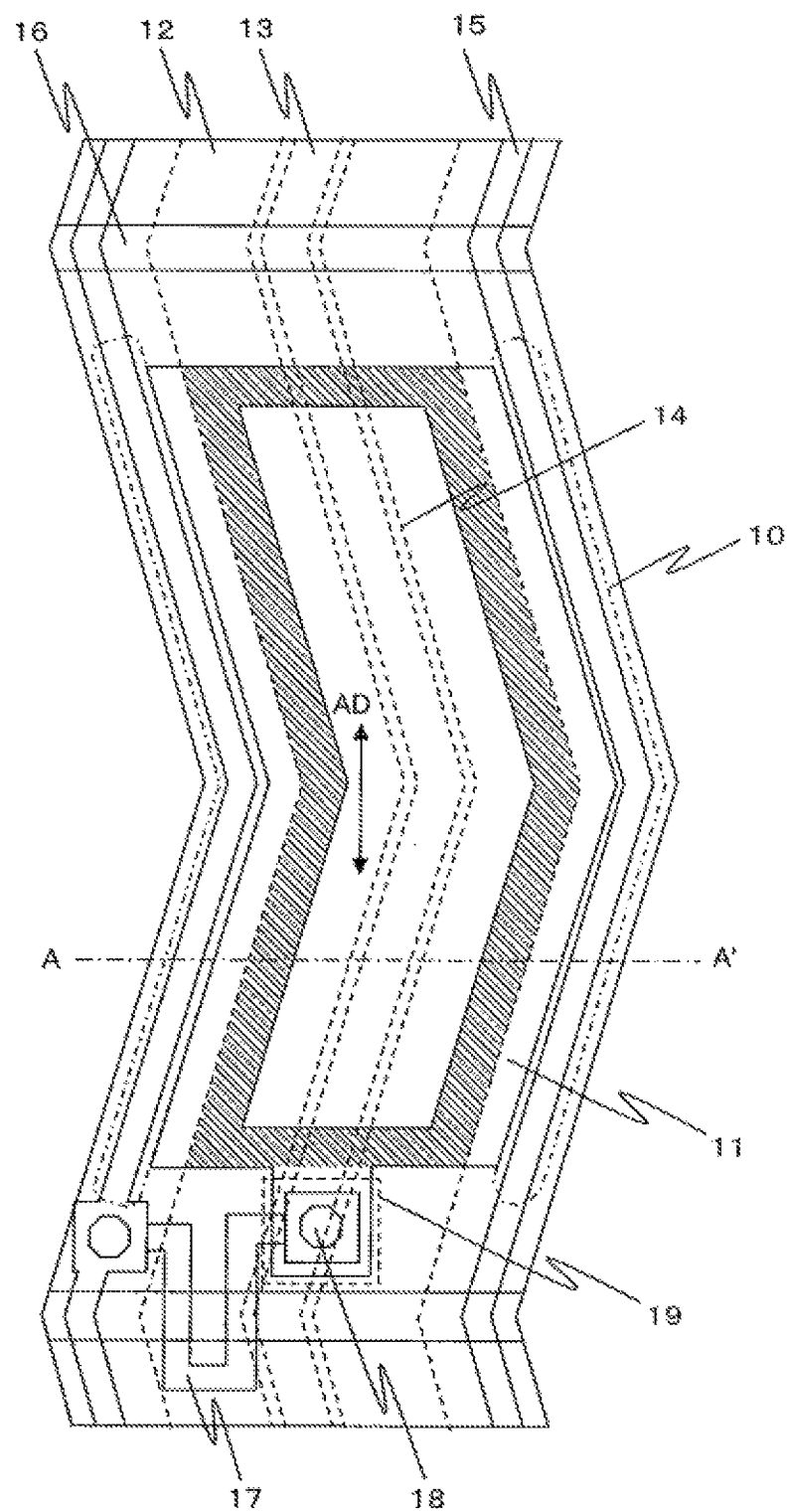
FIG. 6 is a view illustrating a planar structure of a pixel of a liquid crystal display device according to a third embodiment of the present invention.
Figure 7:
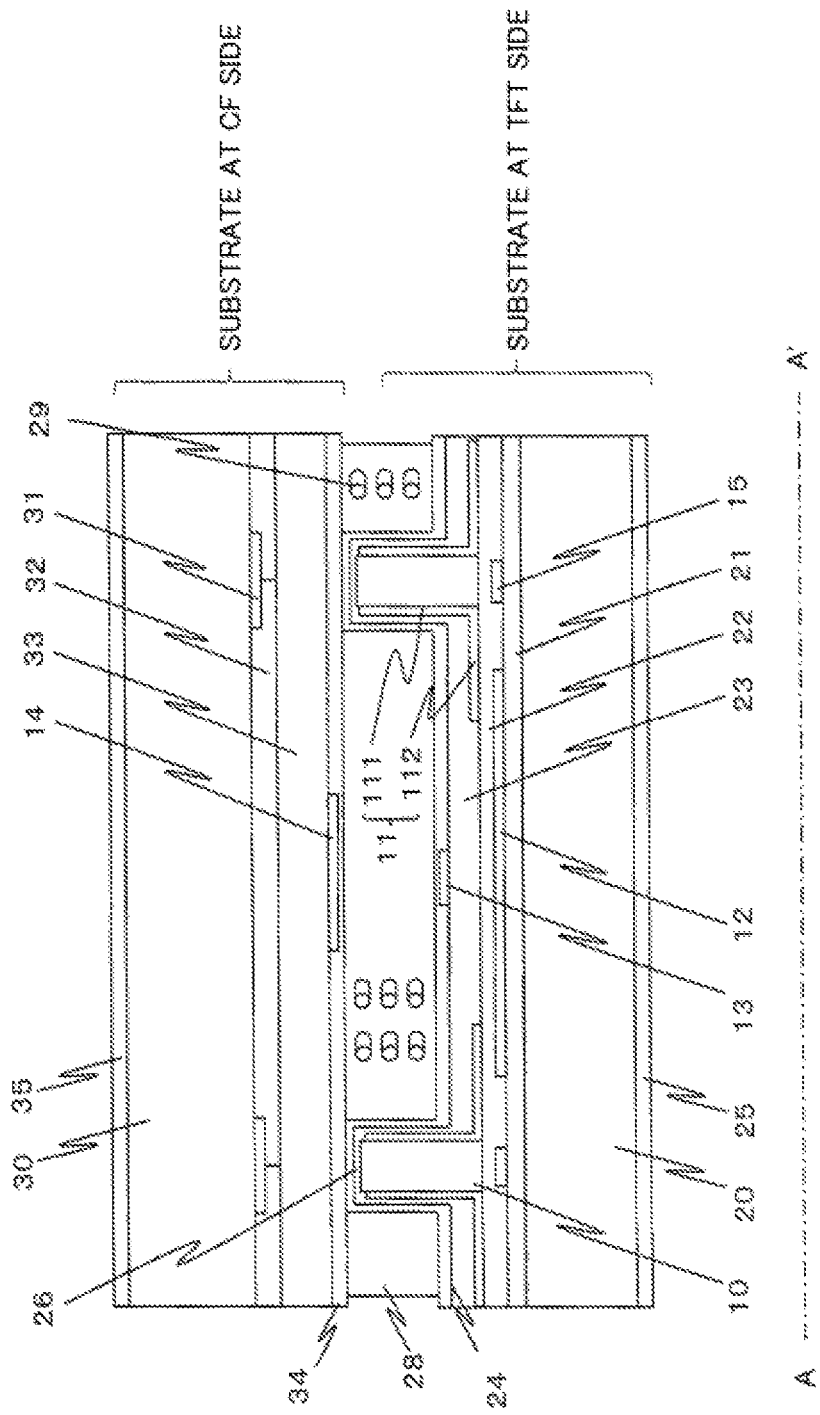
FIG. 7 is a view illustrating a sectional structure of a pixel of the liquid crystal display device according to the third embodiment of the present invention.

A planar structure of one pixel according to a third embodiment of the present invention is illustrated in FIG. 6. A sectional structure of one pixel is illustrated in FIG. 7. As illustrated in FIG. 6, a width of the wall structure 10 is smaller than that in FIG. 1 and the border of the source electrode 11 and the wall structure 10 matches with those illustrated in FIG. 1. As illustrated in FIG. 7, the source electrode 11 is distributed only on the wall surface of the wall structure 10 but is not distributed on the top of the wall structure 10. As illustrated in FIGS. 6 and 7, the wall electrode structure may be achieved by forming a slit on the top of the wall structure by a self-alignment process which will be described below.

Figure 4B:
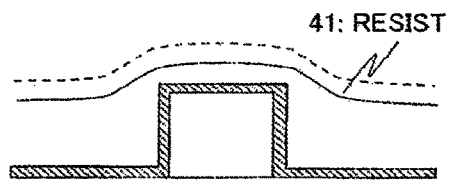
FIG. 4B is a view illustrating a method of patterning the source electrode on the top of the wall structure.
Figure 4C:
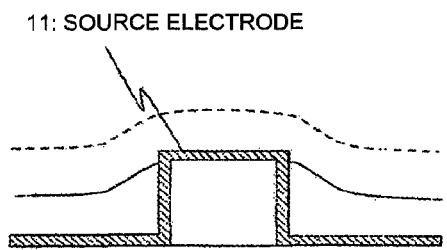
FIG. 4C is a view illustrating a method of patterning the source electrode on the top of the wall structure.
Figure 4D:
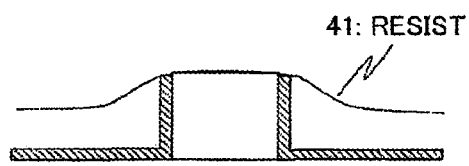
FIG. 4D is a view illustrating a method of patterning the source electrode on the top of the wall structure.
Figure 4E:
FIG. 4E is a view illustrating a method of patterning the source electrode on the top of the wall structure.

As illustrated in FIG. 4A, the resist 41 tend to be thin on the top of the wall structure 10 and thick on the flat portion. If the resist is ashed by a plasma asher, as illustrated in FIG. 4B, the resist 41 is uniformly removed from the surface in proportional to time. The broken line of FIG. 4B indicates a surface of the resist at the time of being applied. Therefore, if the resist is removed by an amount which is slightly larger than the thickness of the top of the wall structure, as illustrated in FIG. 4C, the electrode 11 on the top of the wall structure is selectively exposed. In this state, if an etching process is performed, as illustrated in FIG. 4D, the electrode on the wall electrode may be selectively removed. FIG. 4E illustrates a completed state when the resist 41 is removed from the state of FIG. 4D. Accordingly, if the distribution of the thickness of the resist applied on the wall structure is used, the electrode on the wall structure may be removed by self-alignment.

Figure 8A:
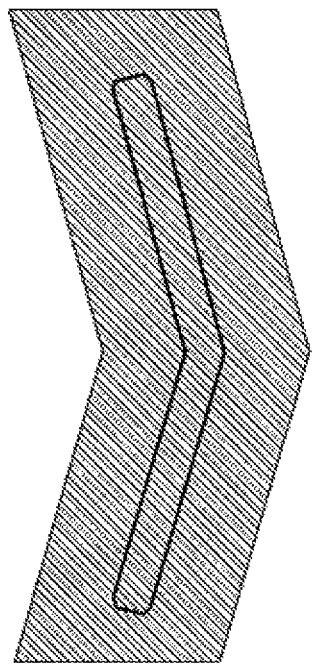
FIG. 8A is a view illustrating patterning by mask exposure according to the third embodiment of the present invention.
Figure 8B:
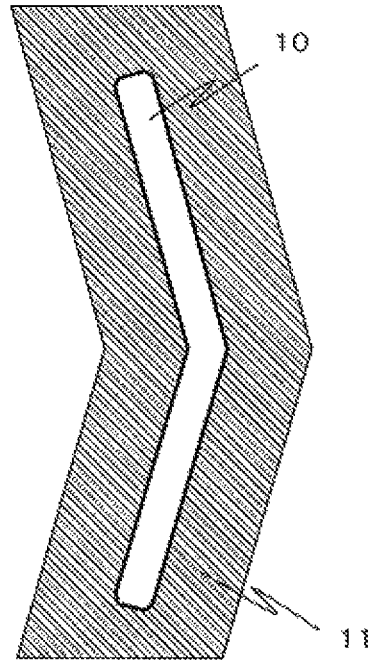
FIG. 8B is a view illustrating patterning by mask exposure according to the third embodiment of the present invention.
Figure 8C:
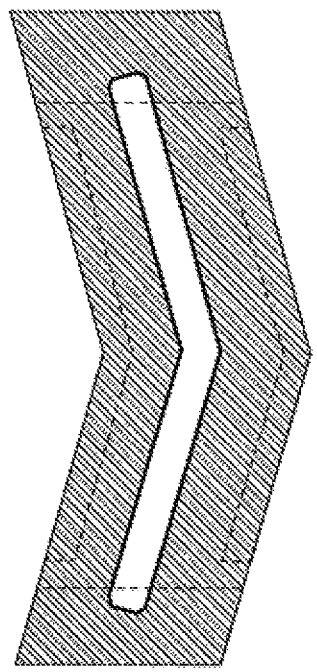
FIG. 8C is a view illustrating patterning by mask exposure according to the third embodiment of the present invention.
Figure 8D:
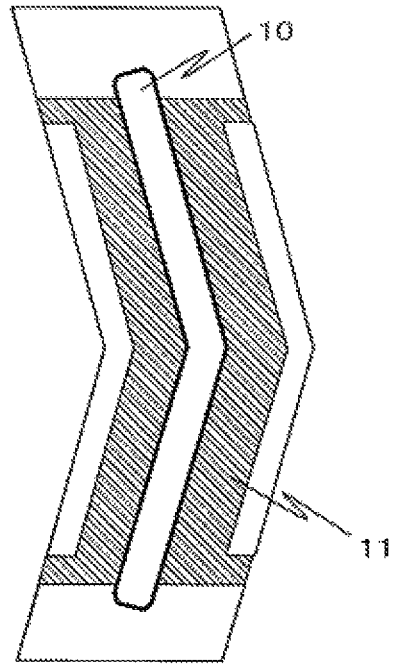
FIG. 8D is a view illustrating patterning by mask exposure according to the third embodiment of the present invention.

A portion other than the top of the wall structure needs to be patterned by separate mask exposure, which may be affected by an adjustment accuracy of the wall structure and the mask. However, if the slit is distributed only on the top of the wall structure, the short circuit does not occur, which will be described below. FIGS. 8A to 8D are plan views illustrating one wall structure and an electrode which is superimposed with the wall structure, and a border of the wall structure is represented by a thick line and the electrode is represented by hatched lines. FIG. 8A illustrates a state when the electrode is formed on the entire surface. As illustrated in FIG. 8B, the electrode on the top of the wall structure is removed by the above-mentioned self-alignment process. Next, as illustrated in FIGS. 8C and 8D, an electrode on a portion other than the top of the wall structure is patterned using the mask exposure. FIG. 8C illustrates a state when the mask is superimposed in FIG. 8B and the broken line of FIG. 8C indicates a border of a light shielding portion of the mask. FIG. 8D illustrates a wall electrode structure finally formed in the mask arrangement of FIG. 8C and the wall electrode has the same planar distribution as that of the border of the light shielding portion of the mask illustrated in FIG. 8C. In this case, positional deviation of the mask may occur. However, the length of a portion of the wall structure which protrudes from the slit is set to be more than an adjustment accuracy of the mask so that the short circuit is not generated even when an error occurs in the position adjustment of the mask.

Further, by applying a self-alignment process, a likelihood design that considers the adjustment accuracy of the mask in the slit is not required and the width of the wall structure may be reduced to be the width determined with the processing accuracy. For example, if the adjustment accuracy of the mask is 1.5 µm with respect to a reference layer and a width of the slit is 3.0 µm, a width of the wall structure needs to be 9.0 µm in order to stably form the electrode on both wall surfaces of the wall structure. In the meantime, since the processing accuracy of the wall structure is, for example, 4.0 µm, it is possible to reduce the width of the wall structure to be equal to or less than half thereof by using the self-alignment process. As a result, it is possible to increase the aperture ratio and achieve a higher transmission.

First Comparative Embodiment

Figure 9:
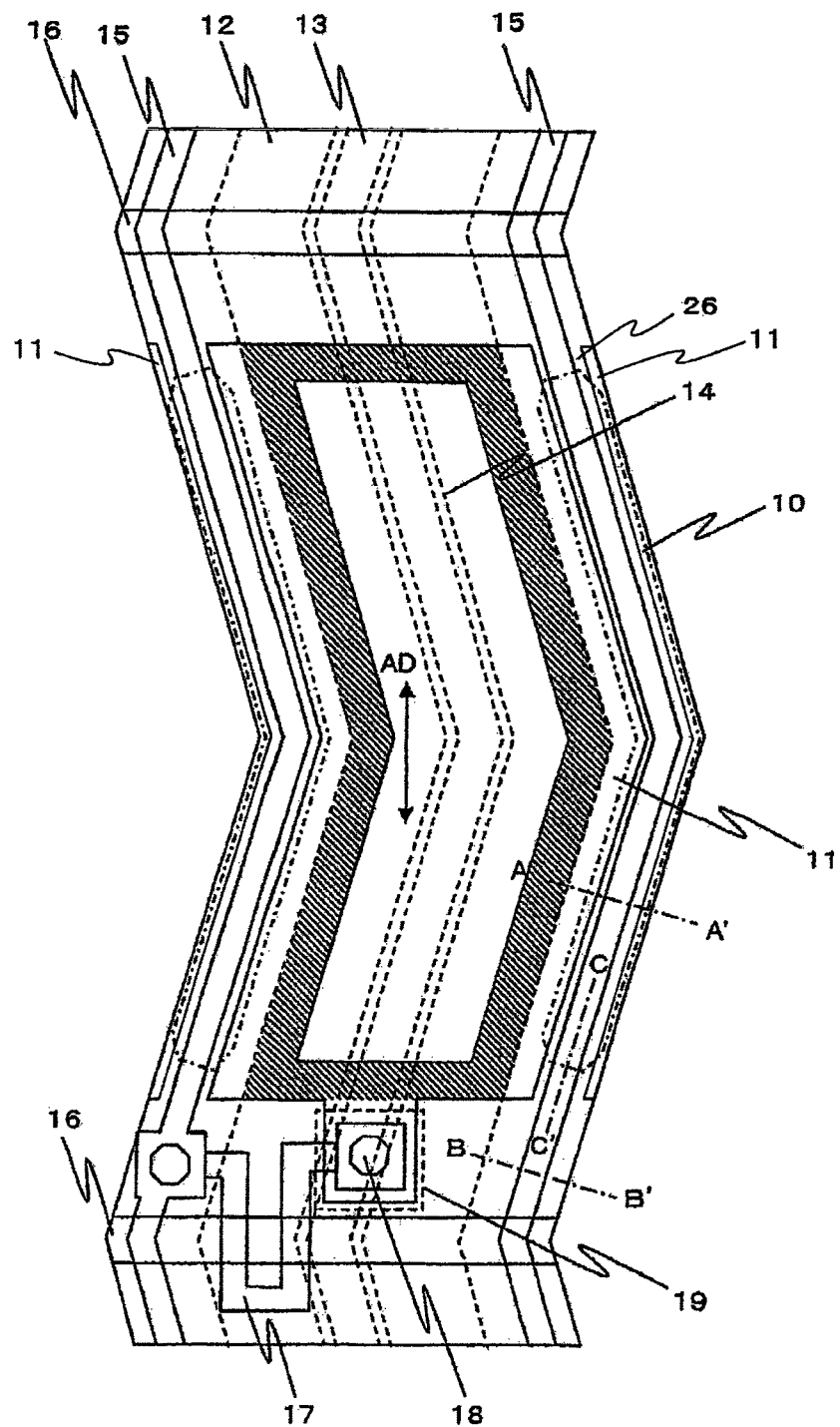
FIG. 9 is a view illustrating a planar structure of a pixel of a liquid crystal display device according to a first comparative embodiment of the present invention.
Figure 10A:
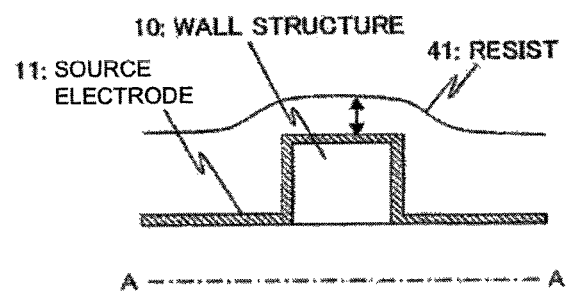
FIG. 10A is a view illustrating a case when a slit is continuously distributed between a top of a wall structure and a flat portion.
Figure 10B:
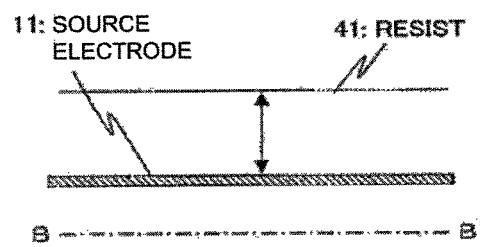
FIG. 10B is a view illustrating a case when a slit is continuously distributed between a top of a wall structure and a flat portion.

In FIG. 9, a planar structure of one pixel according to a first comparative embodiment is illustrated. In the first embodiment, even though the slit is distributed only on the top of the wall structure, as illustrated in FIG. 9, the slit 26 is distributed on both the top of the wall structure 10 and the flat portion. In FIG. 9, since the slit is continuously distributed between the top of the wall structure and the flat portion so that the slit 26 climbs over the border of the wall structure to be distributed. When the slit is formed in the source electrode 11, a cross-section of a state when the resist 41 is applied is illustrated in FIGS. 10A and 10B. FIGS. 10A and 10B are cross-sectional views in the top of the wall structure and the flat portion and correspond to the one-dot chain lines A-A' and B-B' of the plan view illustrated in FIG. 9. Further, in FIGS. 10A and 10B, an effective resist thickness in forming the slit is represented by an arrow. Similarly to FIG. 4, the resist 41 of FIG. 10A corresponding to the top of the wall structure is thin and the resist 41 in FIG. 10B corresponding to the flat portion is thick. Therefore, the top of the wall structure may be overetched and the flat portion may be underetched.

Figure 10C:
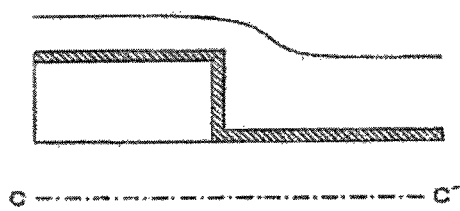
FIG. 10C is a view illustrating a case when a slit is continuously distributed between a top of a wall structure and a flat portion.
Figure 10D:
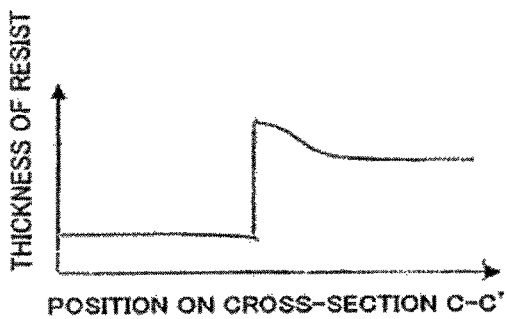
FIG. 10D is a view illustrating a case when a slit is continuously distributed between a top of a wall structure and a flat portion.
Figure 11A:
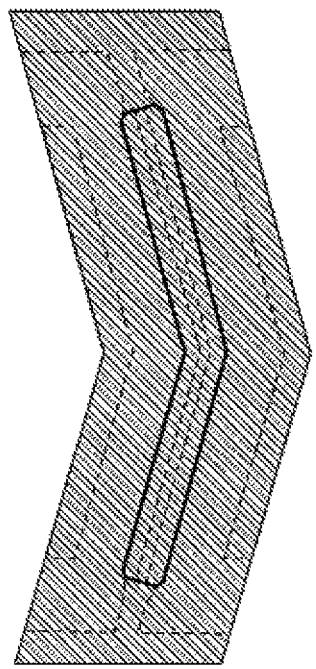
FIG. 11A is a view illustrating patterning by mask exposure according to the first comparative embodiment of the present invention.
Figure 11B:
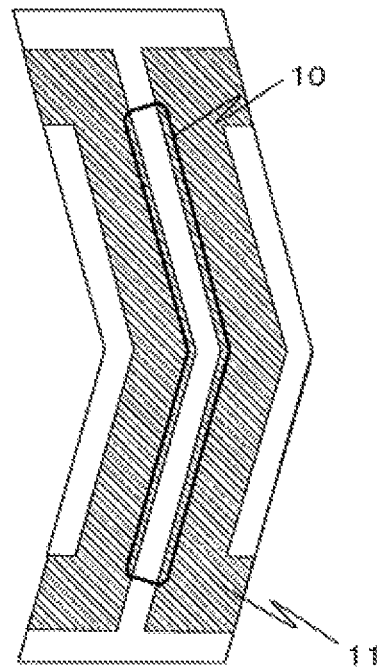
FIG. 11B is a view illustrating patterning by mask exposure according to the first comparative embodiment of the present invention.

In order to collectively process the top of the wall structure and the slit of the flat portion with the same width, it is considered to change a width of the slit on the mask as illustrated in FIGS. 11A to 11D. FIG. 11A illustrates a relationship of the width of the slit on the mask and the wall structure and it is considered that the adjustment error of the mask does not occur. FIG. 11B is a completed state corresponding to FIG. 11A. As illustrated in FIG. 11A, the width of the slit on the mask becomes narrower than the completion size on the top of the wall structure but wider than the completion size on the flat portion. Here, there is an object how to determine the width of the slit of the climb-over portion, for which the thickness distribution of the resist near the climb-over portion serves as a useful reference. FIG. 10C is a cross-sectional view including neighboring of the climb-over portion and corresponds to the one-dot chain line C-C' of FIG. 9. FIG. 10D is a view when the thickness distribution of the resist is obtained from FIG. 10C. The thickness of the resist is the largest on the flat portion which approaches the climb-over portion. For example, the width of the slit may be continuously changed so as to correspond to the thickness distribution of the resist before/after the climb-over portion. Specifically, as illustrated in FIG. 11A, the width of the slit is maximized on the flat portion approaching the climb-over portion and continuously becomes narrower toward the direction of the wall structure. Therefore, as illustrated in FIG. 11B, the slit may be collectively formed on both the top of the wall structure and the flat portion or may be formed even on the climb-over portion.

Figure 11C:
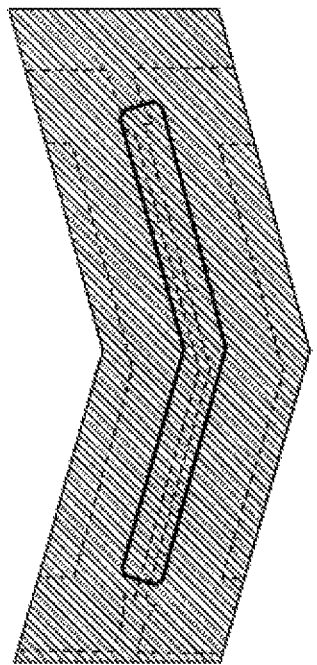
FIG. 11C is a view illustrating patterning by mask exposure according to the first comparative embodiment of the present invention.
Figure 11D:
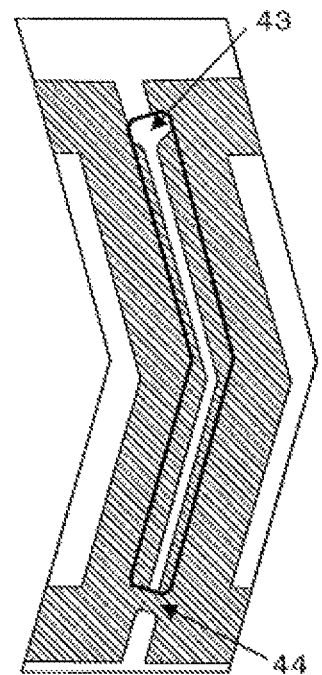
FIG. 11D is a view illustrating patterning by mask exposure according to the first comparative embodiment of the present invention.

However, an example that a shape of the completed slit is largely different from that in FIG. 11B is actually found. An example thereof is illustrated in FIG. 11D. The width of the slit is significantly increased around the climb-over portion in an overetched portion 43 in FIG. 11D and the slit disappears around the climb-over portion in an underetched portion 44 of FIG. 11D. Specifically, in the underetched portion 44, the source electrodes of two adjacent pixels are short-circuited to be point imperfection. The shape of the slit as illustrated in FIG. 11D is generated when the mask for processing the slit with respect to the wall structure is downwardly deviated as illustrated in FIG. 11C. In FIG. 11C, the border of the light shielding portion of the mask is represented by a broken line. The overetched portion 43 in FIG. 11D is generated by being overetched when a portion having a largest slit width is disposed above the wall electrode having a small resist thickness on the mask. The underetched portion 44 in FIG. 11D is generated by being underetched when a portion having a small slit width is disposed in the flat portion approaching the climb-over portion having a large resist thickness on the mask.

As described above, if there is a wall structure having a height which is equal to the thickness of the liquid crystal layer, it is difficult to collectively process the slits distributed by climbing over the wall structure with a high yield when the position adjustment accuracy of the mask is considered. Further, even though the slit width on the mask is changed so as to correspond to the thickness distribution of the resist, the alignment deviation of the mask is more than the range where the slit width is changed. Therefore, it is difficult to correct the change in the resist thickness as estimated by a design.

In the liquid crystal display device according to the first embodiment of the present invention, the mask is used so as to distribute the slit 26 which becomes the border of the wall electrodes 111 of the two adjacent pixels only on the top of the wall structure 10 to expose the resist, expose the transparent electrode on the wall structure, and remove the transparent electrode on the exposed wall structure. Therefore, it is possible to form a wall structure on which the slit 26 which becomes the border of the wall electrode 111 of the two adjacent pixels is distributed only on the top of the wall structure 10.

Second Comparative Embodiment

Figure 12A:
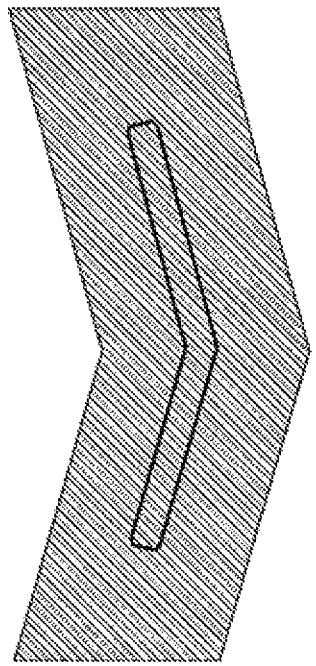
FIG. 12A is a view illustrating patterning by mask exposure according to a second comparative embodiment of the present invention.
Figure 12B:
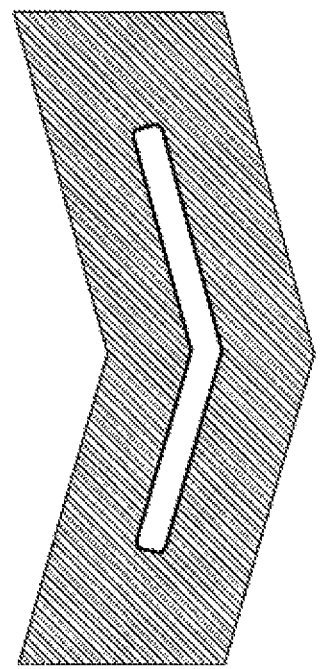
FIG. 12B is a view illustrating patterning by mask exposure according to the second comparative embodiment of the present invention.
Figure 12C:
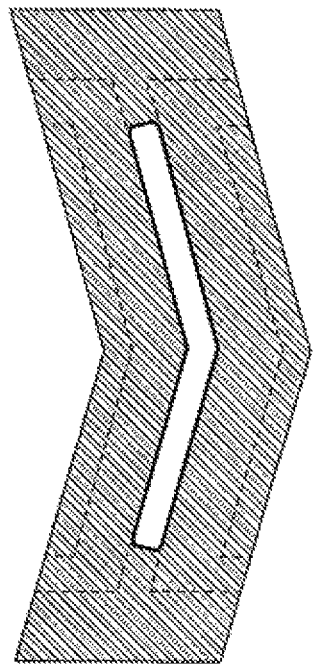
FIG. 12C is a view illustrating patterning by mask exposure according to the second comparative embodiment of the present invention.
Figure 12D:
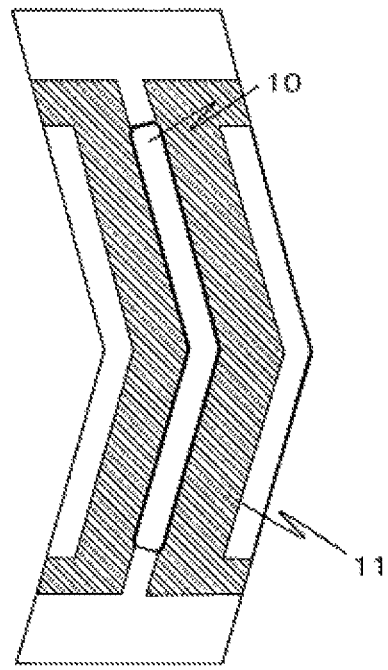
FIG. 12D is a view illustrating patterning by mask exposure according to the second comparative embodiment of the present invention.
Figure 12E:
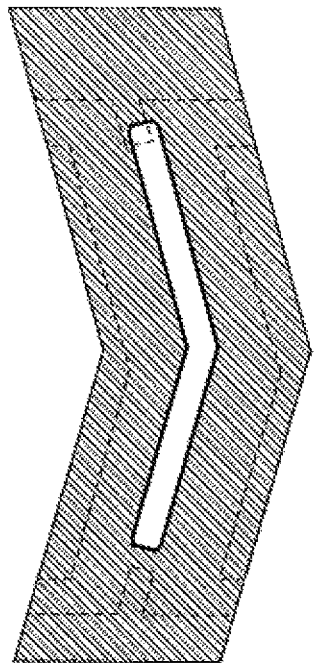
FIG. 12E is a view illustrating patterning by mask exposure according to the second comparative embodiment of the present invention.
Figure 12F:
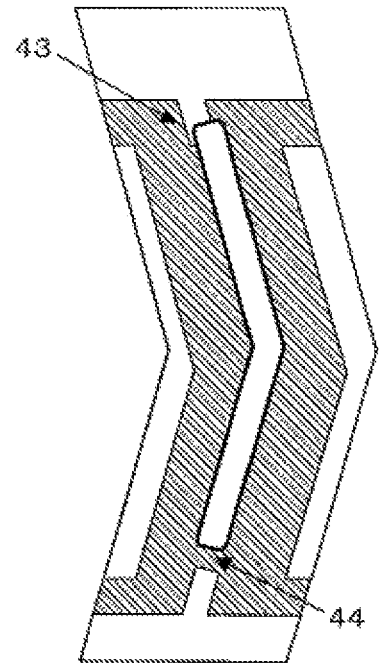
FIG. 12F is a view illustrating patterning by mask exposure according to the second comparative embodiment of the present invention.

In a structure where the slit is distributed on both the top of the wall structure and the flat portion, the self-alignment process of the third embodiment is applied. As described in the third embodiment, an advantage of the self-alignment process is that the width of the wall structure is reduced to the processing accuracy of the wall structure to increase the aperture ratio. In this case, the slit of the flat portion is formed by the mask exposure. However, in this case, the short circuit may be generated by the adjustment accuracy of the mask. FIGS. 12A to 12F are plan views when one wall structure and an electrode which is superimposed with the wall structure are considered. FIG. 12A illustrates a state when an electrode is formed on an entire surface including the top of a wall structure and FIG. 12B illustrates a state when the top of the wall structure is selectively etched by the self-alignment process. FIG. 12C illustrates a state when a mask is superimposed with the state in FIG. 12B. If there is no alignment deviation as illustrated in FIG. 12C, a slit of a flat portion may be formed without a short circuit as illustrated in FIG. 12D. However, if alignment deviation occurs in a longitudinal direction as illustrated in FIG. 12E, the slit disappears from any one of the upper and lower flat portions of the wall structure and the source electrodes of the two adjacent pixels are short-circuited, as illustrated in FIG. 12F.

Figure 13A:
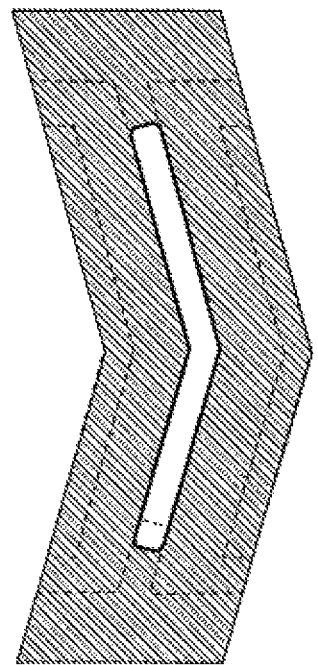
FIG. 13A is a view illustrating patterning by mask exposure according to the second comparative embodiment of the present invention.
Figure 13B:
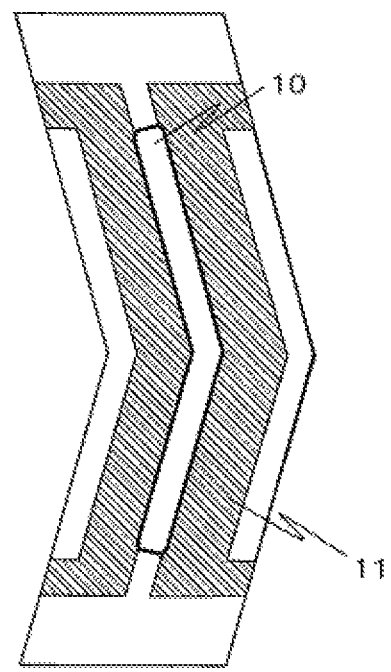
FIG. 13B is a view illustrating patterning by mask exposure according to the second comparative embodiment of the present invention.
Figure 13C:
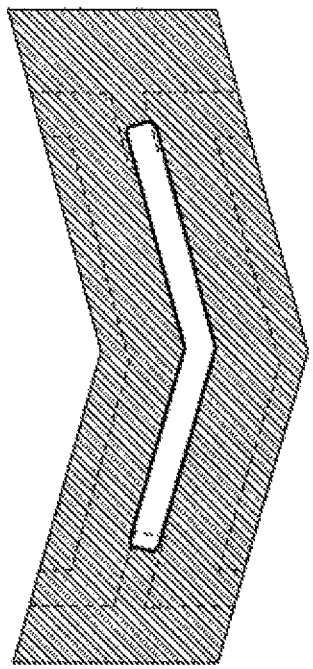
FIG. 13C is a view illustrating patterning by mask exposure according to the second comparative embodiment of the present invention.
Figure 13D:
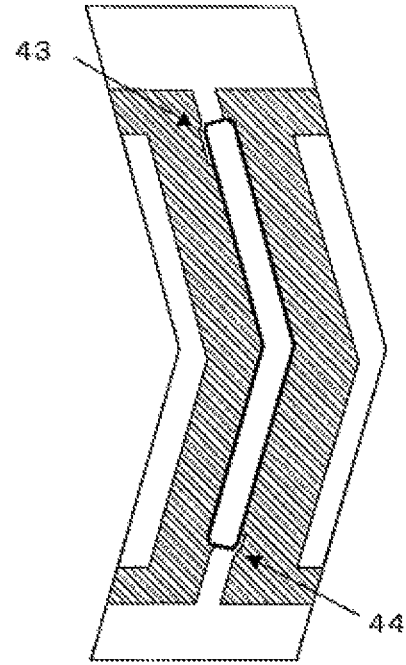
FIG. 13D is a view illustrating patterning by mask exposure according to the second comparative embodiment of the present invention.

As a measurement against the alignment deviation, it is considered to extend the slit formed by the mask exposure from the flat portion to a part of the top of the wall structure. FIG. 13A illustrates a state when the mask is superimposed with the state illustrated in FIG. 12B and if there is no alignment deviation as illustrated in FIG. 13B, the source electrode may be formed without occurring the overetching or underetching. However, when the alignment deviation of the mask occurs in the longitudinal direction as illustrated in FIG. 13C, the overetched portions 43 are generated at the upper and lower edges of the wall structure as illustrated in FIG. 13D and the electrode disappears from the wall surface. In a portion where the electrode disappears from the wall surface, the intensity of the electric field which will be applied to the liquid crystal layer is lowered so that the transmittance is lowered. An advantage of the self-alignment process is to reduce the width of the wall structure to the processing accuracy of the wall structure. However, in this case, the width of the wall structure is substantially same as the width of the mask such that a slit is formed on the flat portion having a large width of the resist film. Therefore, if the alignment deviation of the mask occurs, an ITO film on the wall surface is etched so that the electrode disappears from the wall surface.

As described above, if there is a wall structure having the same height as a thickness of a liquid crystal layer, it is difficult to process a slit distributed with a high yield while climbing over the wall structure even using a self-alignment process when considering the alignment accuracy of the mask.

What is claimed is:

1. A liquid crystal display device, comprising a first substrate, a second substrate, and a liquid crystal layer sandwiched between the first substrate and the second substrate, the first substrate comprising:
a plurality of identical pixels arranged in a matrix, an insulator wall structure between each pixel in a row of pixels, with the insulator wall structures formed along a plurality of signal wiring lines;
a single source electrode in a first pixel, with the source electrode comprising a planar portion that is electrically connected via a thin film transistor to a respective signal wiring line, and two wall electrodes formed continuously with the planar portion, found on the respective insulator wall structure on either side of the pixel unit;
a neighboring second pixel sharing an insulator wall structure with the first pixel includes another wall electrode on its respective side of the bordering insulator wall structure, and the wall electrodes of the first and second pixels formed on either side of the bordering insulator wall structure are electrically isolated from each other via a slit on the top of the bordering insulator wall structure;
wherein a length of the slit along the signal wiring line is shorter than a length of the insulator wall structure along the signal wiring line,
wherein the planar portion has an opening of a width W1 perpendicular to the signal wiring line and a length L1 along the signal wiring line between the insulator wall structures,
wherein a first common electrode of a planar shape is formed between the insulator wall structures, partially overlapping with the planar portion of the source electrode via a first insulating layer in a plan view, and a retentive capacitance is formed between the source electrode and the first common electrode,
wherein a second common electrode is formed between the insulator wall structures on a different layer from the planar portion of the source electrode via a second insulating layer,
wherein a signal voltage is applied to the source electrode so as to form a planar field between the second common electrode to drive liquid crystals, and
wherein the insulator wall structure contacts the second substrate.

2. The liquid crystal display device according to claim 1, wherein the wall electrode is formed to a top surface of the insulator wall structure at the border of the pixels.

3. The liquid crystal display device according to claim 1, wherein the wall electrode is formed only on a side of the insulator wall structure at the border of the pixels.

4. The liquid crystal display device according to claim 1, wherein the insulator wall structure is fragmented at an edge of the pixel in the longitudinal direction and the wall electrode of the source electrode is formed inside an edge of the insulator wall structure.

5. The liquid crystal display device according to claim 1, wherein the insulator wall structure is continuous at an edge of the pixel in the longitudinal direction.

6. The liquid crystal display device according to claim 1, further comprising:
a third common electrode between the source electrodes at both sides of the pixel on a substrate at a color filter side.

7. The liquid crystal display device according to claim 1, wherein the pixel has a V shape, a liquid crystal alignment direction is constant in the pixel, angles formed by the extending direction of the insulator wall structure and the liquid crystal alignment direction are the same in one portion and the other portion of the pixel, and the extending direction of the insulator wall structure is inclined in an opposite direction to the liquid crystal alignment direction in one portion and the other portion of the pixel.

* * * * *